United States Patent
Ferrant et al.

(10) Patent No.: US 9,390,771 B2
(45) Date of Patent: Jul. 12, 2016

(54) CIRCUIT AND METHOD FOR SENSING A DIFFERENCE IN VOLTAGE ON A PAIR OF DUAL SIGNAL LINES, IN PARTICULAR THROUGH EQUALIZE TRANSISTOR

(71) Applicant: SOITEC, Bernin (FR)

(72) Inventors: Richard Ferrant, Esquibien (FR); Roland Thewes, Kleinmachnow (DE)

(73) Assignee: Soitec (FR)

( * ) Notice: Subject to any disclaimer, the term of this patent is extended or adjusted under 35 U.S.C. 154(b) by 0 days.

(21) Appl. No.: 14/372,345

(22) PCT Filed: Jan. 16, 2013

(86) PCT No.: PCT/EP2013/050760
§ 371 (c)(1),
(2) Date: Jul. 15, 2014

(87) PCT Pub. No.: WO2013/107779
PCT Pub. Date: Jul. 25, 2013

(65) Prior Publication Data
US 2014/0376318 A1     Dec. 25, 2014

(30) Foreign Application Priority Data
Jan. 16, 2012   (FR) ...................................... 12 50398

(51) Int. Cl.
*G11C 7/00*   (2006.01)
*G11C 7/08*   (2006.01)
(Continued)

(52) U.S. Cl.
CPC   *G11C 7/08* (2013.01); *G11C 7/062* (2013.01); *G11C 7/12* (2013.01); *G11C 11/4091* (2013.01); *G11C 11/4094* (2013.01); *G11C 2211/4016* (2013.01)

(58) Field of Classification Search
CPC ........... G11C 7/22; G11C 7/06; G11C 7/1051
USPC .................................. 365/189.11, 210.1, 205
See application file for complete search history.

(56) References Cited

U.S. PATENT DOCUMENTS 5,327,317 A * 7/1994 Lee .................................. 361/88
5,453,951 A * 9/1995 Proebsting ..................... 365/181
(Continued)

FOREIGN PATENT DOCUMENTS

EP   0411818 A2   2/1991
FR   2974656 A1   11/2012
(Continued)

OTHER PUBLICATIONS

International Search Report & Written Opinion for Application No. PCT/EP2013/050760 dated Feb. 28, 2013.

*Primary Examiner* — Connie Yoha
(74) *Attorney, Agent, or Firm* — Lerner, David, Littenberg, Krumholz & Mentlik, LLP

(57) ABSTRACT

A circuit for sensing a difference in voltage on a pair of dual signal lines comprising a first signal line and a second signal line complementary to the first signal line, comprising:
a pair of cross-coupled inverters arranged between the first and the second signal lines, each inverter having a pull-up transistor and a pull-down transistor, the sources of the pull-up transistors or of the pull-down transistors being respectively connected to a first and a second pull voltage signals,
a decode transistor having source and drain terminals respectively coupled to one of the first and second signal lines and a gate controlled by a decoding control signal, whereby when the decode transistor is turned on by the decoding control signal, a short circuit is established between the first and the second signal lines through which current flows from one of the first and second pull voltage signals, thereby generating a disturb in between the first and the second pull voltage signals.

11 Claims, 5 Drawing Sheets

(51) Int. Cl.
*G11C 7/06* (2006.01)
*G11C 7/12* (2006.01)
*G11C 11/4091* (2006.01)
*G11C 11/4094* (2006.01)

(56) References Cited

U.S. PATENT DOCUMENTS

| | | | | |
|---|---|---|---|---|
| 5,568,073 | A | * | 10/1996 | McClure .......................... 327/51 |
| 5,936,905 | A | * | 8/1999 | Proebsting ..................... 365/208 |
| 6,473,349 | B1 | * | 10/2002 | Flannagan ..................... 365/205 |
| 8,953,399 | B2 | | 2/2015 | Ferrant et al. |
| 2004/0213064 | A1 | | 10/2004 | Gyohten et al. |
| 2012/0275252 | A1 | | 11/2012 | Ferrant et al. |
| 2012/0275254 | A1 | | 11/2012 | Ferrant et al. |
| 2014/0321225 | A1 | * | 10/2014 | Ferrant et al. .............. 365/210.1 |

FOREIGN PATENT DOCUMENTS

| | | |
|---|---|---|
| FR | 2974666 A1 | 11/2012 |
| FR | 2974667 A1 | 11/2012 |

* cited by examiner

CIRCUIT AND METHOD FOR SENSING A DIFFERENCE IN VOLTAGE ON A PAIR OF DUAL SIGNAL LINES, IN PARTICULAR THROUGH EQUALIZE TRANSISTOR

FIELD OF THE INVENTION

The invention relates generally to a semiconductor circuit, such as semiconductor memory, for instance a Dynamic Random Access Memory (DRAM), and more particularly to a circuit for sensing a difference in voltage on a pair of dual signal lines, for instance a sense amplifier for sensing and amplifying data stored in a plurality of memory cells of a memory cell array.

BACKGROUND OF THE INVENTION

Basically, a DRAM is an integrated circuit that stores data in binary form (e.g., "1" or "0") in a large number of cells. The data is stored in a cell as a charge on a capacitor located within the cell. Typically, a high logic level is in general equal to the power supply voltage and a low logic level is in general equal to ground.

The cells of a conventional DRAM are arranged in an array so that individual cells can be addressed and accessed. The array can be thought of as rows and columns of cells. Each row includes a word line that interconnects cells on the row with a common control signal. Similarly, each column includes a bit line that is coupled to at most one cell in each row. Thus, the word and bit lines can be controlled so as to individually access each cell of the array.

To read data out of a cell, the capacitor of a cell is accessed by selecting the word line associated with the cell. A complementary bit line that is paired with the bit line for the selected cell is equilibrated to an equilibrium voltage. This equilibration voltage (Veq) is typically midway between the high Vdd and low Vss (typically ground) logic levels. Thus, conventionally, the bit lines are equilibrated to one-half of the power supply voltage, Vdd/2. When the word line is activated for the selected cell, the capacitor of the selected cell discharges the stored voltage onto the bit line, thus changing the voltage on the bit line. A differential amplifier, conventionally referred to as a sense amplifier, is then used to detect and amplify the difference in voltage on the pair of bit lines.

FIG. 1 shows a conventional sense amplifier circuit which comprises ten transistors T1-T10 fabricated in bulk silicon CMOS technology. The sense amplifier comprises a pair of cross-coupled inverters arranged between the first bit line BL and the second bit line /BL complementary to the first bit line:
- a first CMOS inverter having an output connected to the bit line BL and an input connected to the complementary bit line /BL,
- a second CMOS inverter having an output connected to the complementary bit line /BL and an input connected to the bit line BL.

Each CMOS inverter comprises:
a pull-up transistor T1, T2 having a drain and a source, and
a pull-down transistor T3, T4 having a drain and a source, the pull-up transistor T1, T2 and the pull-down transistor T3, T4 of each CMOS inverter having a common drain.

The sources of the pull-down transistors T3, T4 are connected to a foot switch transistor T5, which is itself connected to a pull-down voltage source providing a low supply voltage $V_L$ usually at a low voltage level $V_{BLL}$ referred to as ground GND, and controlled by a foot switch control signal "Sense". The ground level of the low supply voltage $V_{Lsupply}$ is used as a reference for the other voltage levels in the sense amplifier.

In the circuit illustrated by FIG. 1, the foot switch transistor T40 is an N-MOS transistor. When the foot switch control signal "Sense" is high, the foot switch transistor T5 is conducting, and the ground voltage is transmitted to the common source node of the pull-down transistors T3, T4. When the foot switch control signal "Sense" is low, the foot switch transistor T5 is blocked and the common source node of the pull-down transistors T3, T4 is not pulled down.

The sources of the pull-up transistors T21, T22 are connected to a pull-up voltage source providing a high supply voltage $V_H$ usually at a high voltage level such as VDD.

The sense amplifier further comprises an equalization transistor T6 having its source/drain terminals respectively coupled to one of bit lines BL, /BL and having its gate controlled by an equalization control signal. The equalization transistor T50 of the circuit illustrated in FIG. 1 is an N-MOS type transistor.

The sense amplifier further comprises a pair of dedicated precharge transistors T7, T8 respectively coupled to the bit line BL and to the complementary bit line /BL and arranged to precharge the bit lines BL, /BL to a precharge voltage, usually at the mean value between the high supply voltage $V_H$ and the low supply voltage $V_L$. This mean value is usually half the high supply voltage $V_{Hsupply}$ high value, i.e. $V_H/2$, since the low voltage level GND of the low supply voltage $V_L$ is used as a reference for the other voltages and the high supply voltage $V_H$ and low supply voltage $V_{LS}$ are usually then at their high and low voltage level, respectively. A precharge control signal $\rho_{PCH}$ is applied to the gates of said precharge transistors T61, T62.

The sense amplifier further comprises two dedicated decode transistors T9, T10, the gates of which are controlled by a decoding control signal CSL. Each of the decode transistors T9, T10 connects one of the bit lines BL, /BL to a global bit line IO, /IO, also called in-out line. The decode transistors T9, T10 are used to transfer data between the bit lines BL, /BL and the global bit lines IO, /IO.

Although sense amplifiers are technically necessary, from an economical point of view the sense amplifiers can be considered as service circuits of the memory array and therefore as overhead that increases the area of the entire circuit and thus also its cost of fabrication.

Therefore, continuous efforts are made to minimize the area consumption of such sense amplifiers.

SUMMARY OF THE INVENTION

The invention aims at proposing a simplified circuit for sensing a difference in voltage on a pair of dual signal lines. In this respect, the invention proposes according to its first aspect a circuit for sensing a difference in voltage on a pair of dual signal lines comprising a first signal line (BL) and a second signal line (/BL) complementary to the first signal line, comprising:
  a pair of cross-coupled inverters arranged between the first and the second signal lines, each inverter having a pull-up transistor (T1, T2) and a pull-down transistor (T3, T4), the sources of the pull-up transistors or of the pull-down transistors being respectively connected to a first ($V_{H_{IO}}$) and a second ($V_{H/IO}$) pull voltage signals,
  a decode transistor (T11, T12) having source and drain terminals respectively coupled to one of the first and second signal lines and a gate controlled by a decoding control signal (CSL), whereby when the decode transistor is turned on by the decoding control signal, a short circuit is established between the first and the second signal lines through which current flows from one of the first and second pull voltage signals, thereby generating a disturb in between the first and the second pull voltage signals.

Other preferred, although non limitative, aspects of this circuit are as follows:
- the sources of the pull-up transistors are connected to the first and second pull up voltage signals;
- it further comprises a foot switch transistor intercalated between the sources of the pull-down transistors and a pull-down voltage source, the foot switch transistor being controlled by a sense signal;
- the decode transistor, the pull-up and the pull-down transistors are dual gate transistors;
- it is made on a semiconductor-on-insulator substrate comprising a thin layer of semiconducting material separated from a substrate by an insulating layer, and the dual gate transistors each comprises a first and a second gate, one of which is a back gate formed in the substrate below the insulating layer;
- the decode transistor has a first gate controlled by the decoding control signal and a second gate controlled by an equalization control signal;
- the first gate of the decode transistor is a back gate;
- the first and second signal lines are bit lines of a memory cell array.

According to another aspect, the invention relates to a semiconductor memory comprising at least one array of memory cells and at least one circuit according to the first aspect of the invention.

According to yet another aspect, the invention relates to a method of operating a method for sensing a difference in voltage on a pair of dual signal lines comprising a first signal line and a second signal line complementary to the first signal line, comprising the steps of turning on the decode transistor of a circuit according to the first aspect of the invention, and of sensing the difference of current or of voltage between the pull voltage signals with a current sense amplifier or a voltage sense amplifier.

BRIEF DESCRIPTION OF THE DRAWINGS

Other aspects, goals and advantages of the invention will become more apparent upon reading the following detailed description of preferred embodiments thereof, given by way of examples and with reference to the accompanying drawings upon which.

On these figures, functionally similar transistors have identical numerical references.

DETAILED DESCRIPTION OF PREFERRED EMBODIMENTS OF THE INVENTION

In its broader aspect, the invention relates to a new manner of sensing a difference in voltage on a pair of dual signal lines. Although it will be described here below in relation to a sense amplifier circuit and dual signal lines in the form of a bit line and a complementary bit line, it is to be understood that the invention can be implemented on other circuits having dual signal lines, such as in bus drivers which have dual high speed busses (signal and /signal).

Figure 2:
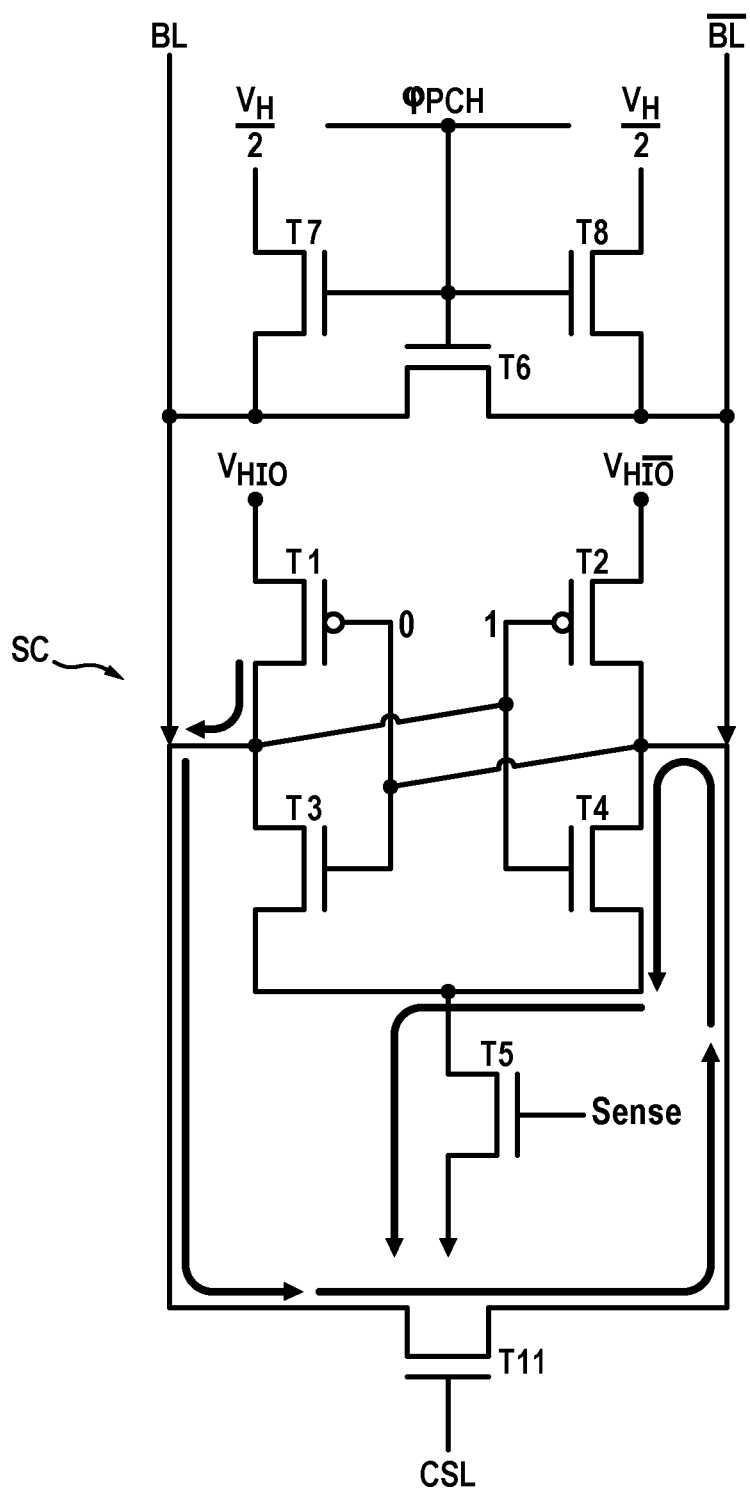
FIG. 2 shows a circuit according to a possible embodiment of the invention.

In relation to FIG. 2, the invention proposes according to a first aspect a circuit for sensing a difference in voltage on a pair of dual signal lines comprising a first signal line and a second signal line complementary to the first signal line. In the exemplary embodiment of FIG. 2, the dual signal lines are bit lines of a memory cell array: a first bit line BL and a second bit line /BL complementary to the first bit line.

Figure 1:
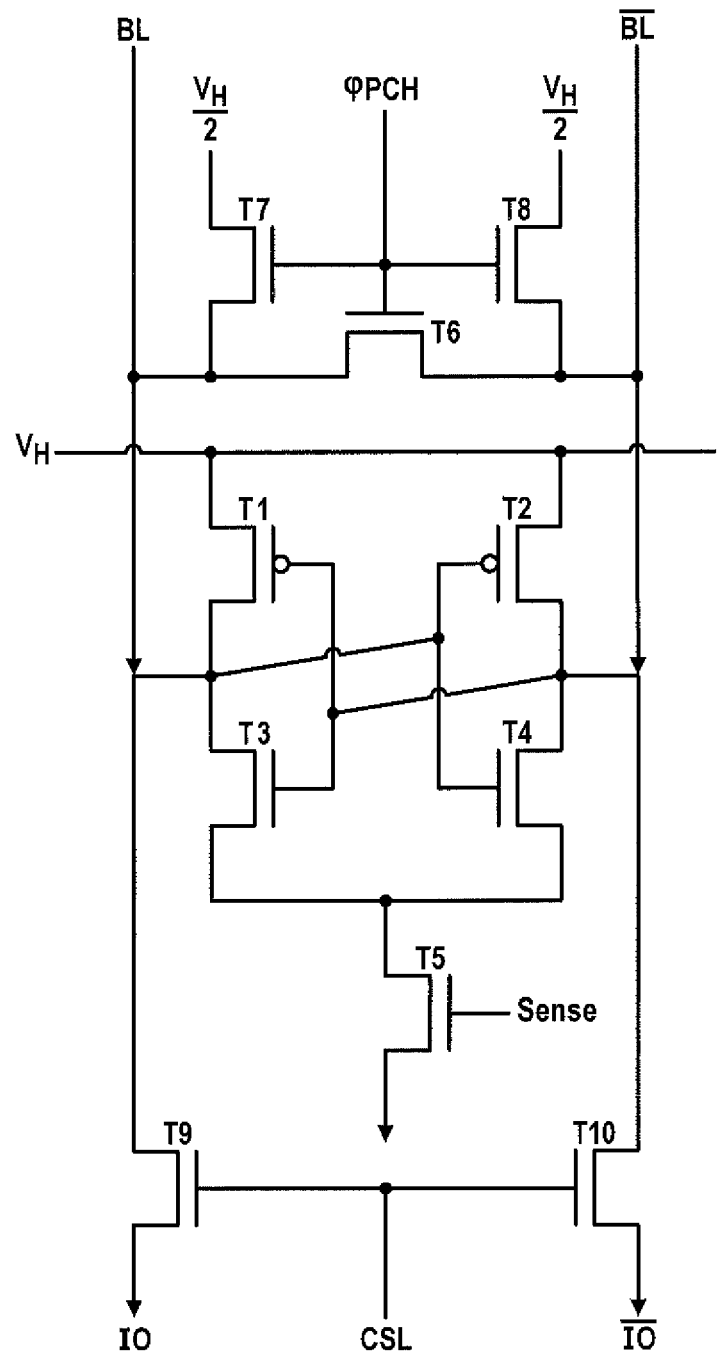
FIG. 1, already described above, shows on conventional sense amplifier circuit.

The sense circuit SC differs from the conventional sense amplifier of FIG. 1 in that it comprises a pair of cross-coupled inverters T1, T3; T2, T4 arranged between the first BL and the second /BL signal lines, each inverter having a pull-up transistor T1, T2 and a pull-down transistor T3, T4, the sources of the pull-up transistors or of the pull-down transistors being respectively connected to a first and a second pull voltage signals.

In the following description, the sources of the pull-up transistors T1, T2 are respectively connected to a first pull up voltage signal $V_{HIO}$ and to a second pull up voltage signal $V_{H/IO}$. It will be understood that the invention also works with the symmetrical counterpart circuit in which the sources of the pull-down transistors T3, T4 are respectively connected to a first pull down voltage signal $V_{LIO}$ and to a second pull voltage signal $V_{L/IO}$.

The sense circuit SC of FIG. 2 further differs from the conventional sense amplifier of FIG. 1 in that the conventional decode transistors T9, T10 of FIG. 1 are suppressed. Instead the sense circuit SC comprises a decode transistor T11 having source and drain terminals respectively coupled to one of the first BL and second /BL signal lines and a gate controlled by a decoding control signal CSL.

Hence when the decode transistor 11 is turned on by the decoding control signal CSL, a short circuit is established between the first BL and the second /BL signal lines through which current flows from one of the first $V_{HIO}$ and second $V_{H/IO}$ pull voltage signals, thereby generating a disturb in between the first $V_{HIO}$ and the second $V_{H/IO}$ pull voltage signals.

Considering the first bit line at "1", then a current path is established as shown by the arrows on FIG. 2. Current flows through the first pull voltage signal $V_{HIO}$ (T1 is in the ON state) while nothing happens on the second pull voltage signal $V_{H/IO}$ (T2 is in the OFF state). Of course situation is opposite if the first bit line at "0.

The two pull voltage signals two signals act as power supply but also as current sources (IO (Input/Output) lines) during decoding (when decode circuit is ON). A secondary current sense amplifier can thereby sense the difference of current between these two IO lines.

The difference of current generates a voltage drop on the corresponding pull voltage signal ($V_{HIO}$ in the example of FIG. 2). Hence, provided the output impedances of the voltage sources $V_{HIO}$, $V_{H/IO}$ is high enough, the difference of voltage can be sensed by a secondary voltage sense amplifier. Compared to the circuit of FIG. 1, it will be appreciated that the circuit of FIG. 2 has a lesser number of transistors (1 transistor on bulk technology) which proves advantageous in that less interconnections are needed, thereby minimizing the area consumption.

Further advantageously, the decode transistor T11 can be either a N or a P transistor, at the convenience of the circuit designer (the phase of the decoding signal CSL being arranged appropriately).

Figure 3:
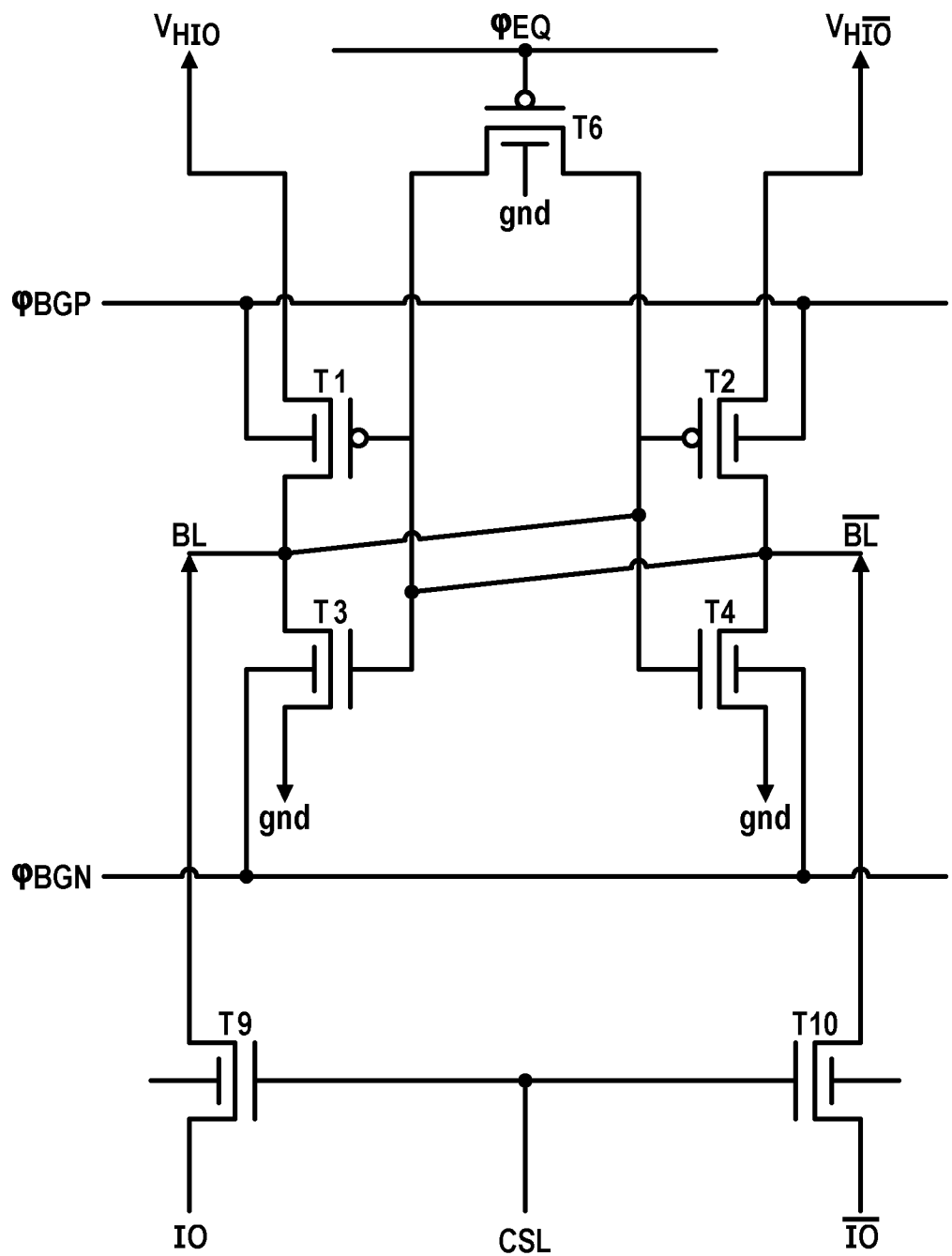
FIG. 3 shows a sense amplifier circuit with dual gate transistors as previously proposed by the Applicant with no dedicated precharge transistors.

Turning now to FIG. 3, an exemplary embodiment of a sense amplifier circuit with dual gate transistors, as described in the French patent application no 1153574 filed by the Applicant on Apr. 26, 2011 and not yet published, is represented.

The sense amplifier of FIG. 3 is preferentially made on a semiconductor-on-insulator substrate comprising a thin layer of semiconducting material separated from a substrate by an insulating layer, and the second gates of the transistors are back gates formed in the substrate below the insulating layer.

According to another embodiment, each dual gate transistor is a Fin-type independent double gate transistor. According to yet another embodiment, each dual gate transistors is made of two single gate transistors arranged in parallel.

The circuit of FIG. 3 differs from the one of FIG. 1 in that the dedicated precharge transistors T7, T8 are suppressed, in that the pull-up transistors T1, T2 are each connected to a respective pull-up control signal $V_{HIO}$ and $V_{H/IO}$, in that the pull-down transistors T3, T5 are directly grounded. In addition, while the first gates of the pull up and pull down transistors are connected to either the first signal line BL or the second signal line /BL, the second gates of the pull-up transistors T1, T2 are both controlled by a pull-up second gate control signal $\rho_{PGP}$ and the second gates of the pull-down transistors are both controlled by a pull-down second gate control signal $\rho_{BGN}$.

Figure 4:
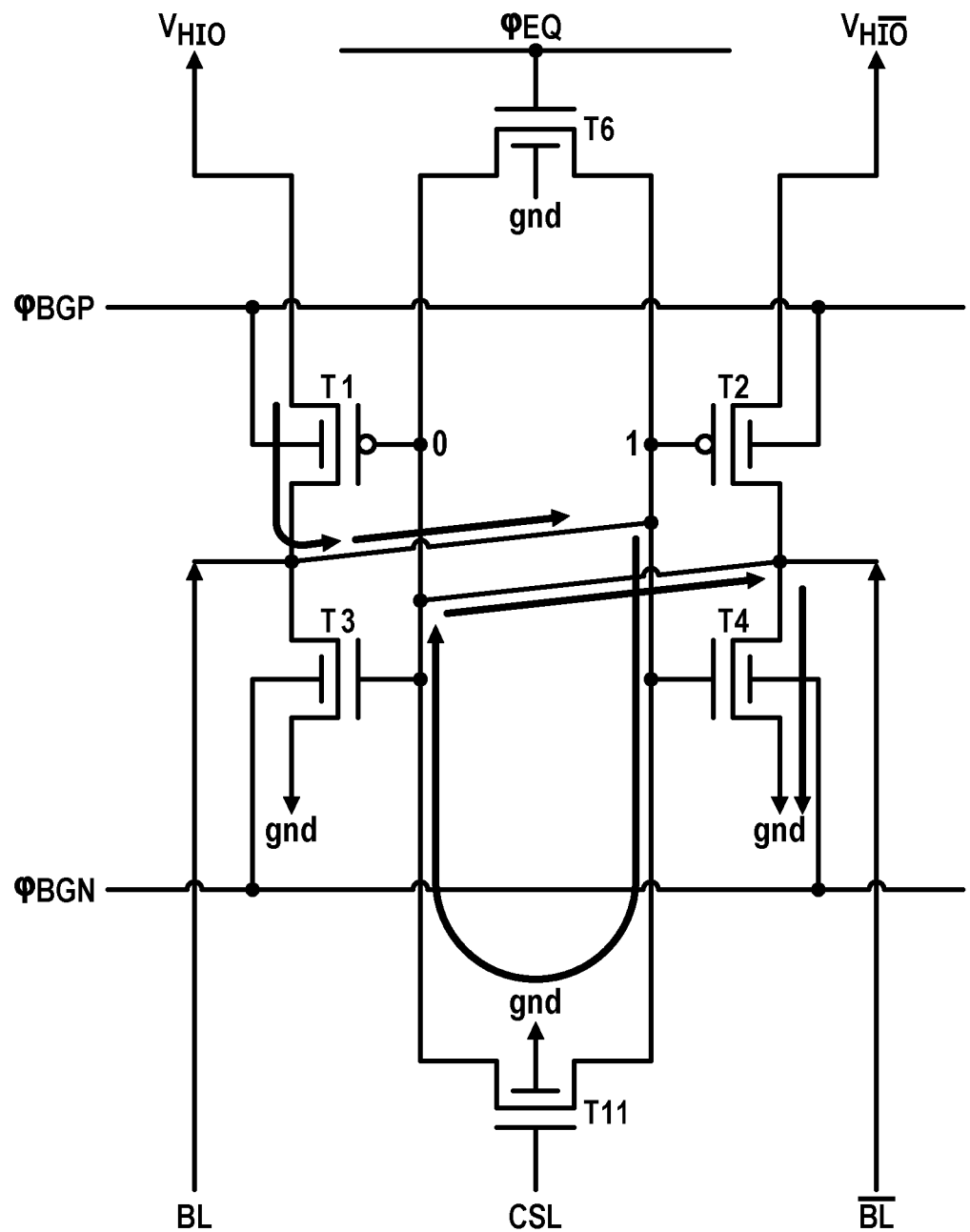
FIG. 4 shows a circuit according to another embodiment of the invention, based on the design of FIG. 3.

FIG. 4 shows a sense circuit according to another embodiment of the invention, based on the design of FIG. 3. It will be appreciated that a sense circuit according to the invention with dual gates transistors can be derived from any one of the proposed sense amplifiers described in French patent applications no 1153573, no 1153574, no 1153575 filed by the Applicant on Apr. 26, 2011 and not yet published.

As shown on FIG. 4, the decode transistors T9, T10 of FIG. 3 are suppressed. Instead the sense circuit comprises a decode transistor T11 having source and drain terminals respectively coupled to one of the first BL and second /BL signal lines and a gate controlled by a decoding control signal CSL.

Hence when the decode transistor 11 is turned on by the decoding control signal CSL, a short circuit is established between the first BL and the second /BL signal lines through which current flows (as shown by the arrows on FIG. 4 in the case the first bit line BL is at "1") from one of the first $V_{HIO}$ and second $V_{H/IO}$ pull voltage signals, thereby generating a disturb in between the first $V_{HIO}$ and the second $V_{H/IO}$ pull voltage signals.

The two pull-up voltage signals act as power supply but also as current sources (IO (Input/Output) lines) during decoding (when decode circuit is ON). A secondary current sense amplifier can thereby sense the difference of current between these two IO lines. The difference of current generates a voltage drop on the corresponding pull voltage signal ($V_{HIO}$ in the example of FIG. 2). Hence, provided the output impedances of the voltage sources $V_{HIO}$, $V_{H/IO}$ is high enough, the difference of voltage can be sensed by a secondary voltage sense amplifier.

Figure 5:
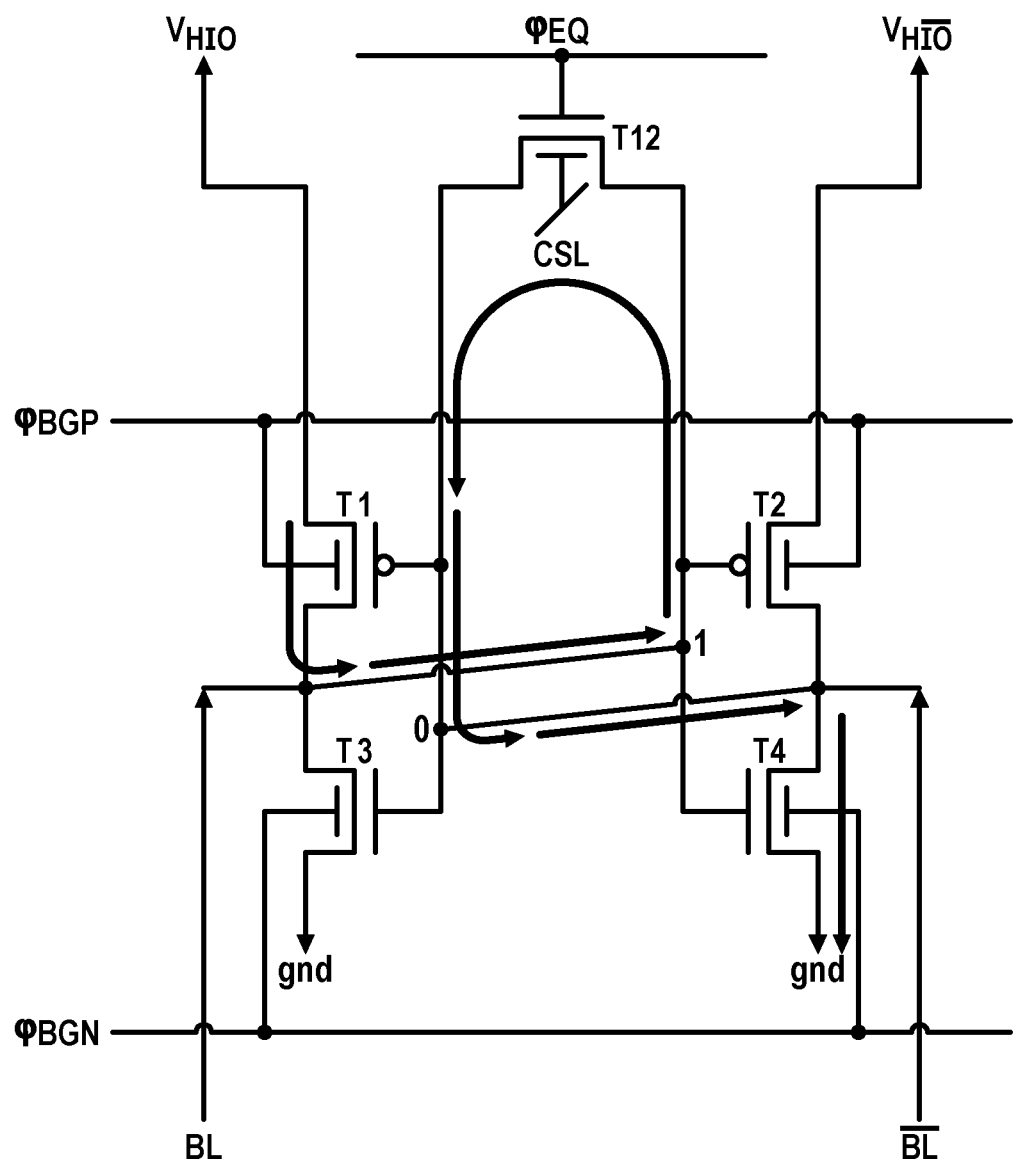
FIG. 5 shows a circuit according to yet another embodiment of the invention.

In the sense circuit of FIG. 4, both equalization transistor T6 and decode transistor T11 are used as single gated transistor (their second gate being merely grounded). In an advantageous variant of FIG. 4 represented on FIG. 5, a single dual gate transistor T12 is used for both equalization and decode functions. This transistor T12 has therefore a first gate controlled by the equalization control signal $\rho_{EQ}$ and a second gate controlled by the decoding control signal CSL. It is to be noted that this advantageous variant is rendered possible if the circuit designer orientates one gate in a first direction (such as the x direction for the equalisation control signal) and the second gate perpendicularly to the first direction (such as the y direction for the decoding control signal. When working with SOI dual gate transistors, due to asymmetric gate oxide thickness, the second gate controlled by the decoding control signal CSL. is preferably the back gate.

It will be appreciated that the invention can be implemented on all technologies: bulk, PDSOI (Partially Depleted Silicon On Insulator), FDSOI (Fully Depleted Silicon On Insulator), as well as with FinFETs and other types of independent double gate transistors. FDSOI proves advantageous it that it enhances the advantages as it allows smaller area per functionality than bulk.

It will further be appreciated that the decode method proposed by the invention (making a temporary short circuit between dual signal lines and detecting the disturb) is not limited to sense amplifier circuits but can be used on many other circuits as long as they exhibit dual signal lines, such as for instance bus driver circuits or analog-to-digital converters.

It will further be appreciated that the invention is not limited to the sense circuit according to its first aspect, but also encompasses a semiconductor memory, in particular a DRAM memory, comprising at least one array of memory cells arranged in rows and columns and at least one sense circuit according to its first aspect arranged as a sense amplifier.

The invention also relates to the method of operating the sense circuit according to its first aspect for sensing a difference in voltage on a pair of dual signal lines comprising a first signal line and a second signal line complementary to the first signal line, the method comprising the steps of turning on the decode transistor of the sense, and of sensing the difference of current or of voltage between the pull voltage signals with a current sense amplifier or a voltage sense amplifier.

The invention claimed is:

1. A circuit for sensing a difference in voltage on a pair of dual signal lines comprising a first signal line and a second signal line complementary to the first signal line, comprising:
    a pair of cross-coupled inverters arranged between the first and the second signal lines, each inverter having a pull-up transistor and a pull-down transistor, the sources of the pull-up transistors or of the pull-down transistors being respectively connected to a first and a second pull voltage signals,
    a decode transistor having source and drain terminals respectively coupled to one of the first and second signal lines and a gate controlled by a decoding control signal, whereby when the decode transistor is turned on by the decoding control signal, a short circuit is established between the first and the second signal lines through which current flows from one of the first and second pull voltage signals, thereby generating a disturb in between the first and the second pull voltage signals, wherein the decode transistor, the pull-up and the pull-down transistors are dual gate transistors.

2. Circuit according to claim 1, wherein the sources of the pull-up transistors are connected to the first and second pull up voltage signals.

3. Circuit according to claim 2, further comprising a foot switch transistor intercalated between the sources of the pull-down transistors and a pull-down voltage source, the foot switch transistor being controlled by a sense signal.

4. Circuit according to claim 1, made on a semiconductor-on-insulator substrate comprising a thin layer of semiconducting material separated from a substrate by an insulating layer, wherein the dual gate transistors each comprise a first and a second gate, one of which is a back gate formed in the substrate below the insulating layer.

5. Circuit according to claim 4, wherein the decode transistor has a first gate controlled by the decoding control signal and a second gate controlled by an equalization control signal.

6. Circuit according to claim 5, wherein the first gate of the decode transistor is a back gate.

7. Circuit according to claim 1, wherein the first and second signal lines are bit lines of a memory cell array.

8. A semiconductor memory, comprising at least one array of memory cells and at least one circuit according to claim 7.

9. A method for sensing a difference in voltage on a pair of dual signal lines comprising a first signal line and a second signal line complementary to the first signal line with a circuit for sensing a difference in voltage on a pair of dual signal lines comprising a first signal line and a second signal line complementary to the first signal line, comprising:

a pair of cross-coupled inverters arranged between the first and the second signal lines, each inverter having a pull-up transistor and a pull-down transistor, the sources of the pull-up transistors or of the pull-down transistors being respectively connected to a first and a second pull voltage signals, a decode transistor having source and drain terminals respectively coupled to one of the first and second signal lines and a gate controlled by a decoding control signal, whereby when the decode transistor is turned on by the decoding control signal, a short circuit is established between the first and the second signal lines through which current flows from one of the first and second pull voltage signals, thereby generating a disturb in between the first and the second pull voltage signals, wherein the decode transistor, the pull-up and the pull-down transistors are dual gate transistors, the method comprising the steps of turning on the decode transistor of the circuit, and of sensing the difference of current or of voltage between the pull voltage signals with a current sense amplifier or a voltage sense amplifier.

10. The circuit according to claim 1, wherein the pull-up transistor and the pull-down transistor of each inverter have a common drain.

11. The circuit according to claim 1, the decode transistor is used to transfer data between:

the first signal line and the second signal line, and the first pull voltage signal and the second pull voltage signal acting as Input/Output lines during decoding.

* * * * *